United States Patent [19]
Sizensky et al.

[11] Patent Number: 5,494,785
[45] Date of Patent: Feb. 27, 1996

[54] HIGH ORTHO-ORTHO BONDED NOVOLAK BINDER RESINS AND THEIR USE IN A PROCESS FOR FORMING POSITIVE RESIST PATTERNS

[75] Inventors: Joseph J. Sizensky, Seekonk, Mass.; Thomas R. Sarubbi, Providence; Medhat A. Toukhy, Barrington, both of R.I.

[73] Assignee: OCG Microelectronic Materials, Inc., West Paterson, N.J.

[21] Appl. No.: 373,685

[22] Filed: Jan. 17, 1995

Related U.S. Application Data

[62] Division of Ser. No. 57,999, May 7, 1993, Pat. No. 5,413,894.

[51] Int. Cl.$^6$ .............. G03F 7/021; C08G 8/04; C08F 283/00
[52] U.S. Cl. .............. 430/326; 430/165; 430/192; 430/193; 525/480; 525/501; 528/155; 528/156
[58] Field of Search ............... 430/165, 192, 430/193, 326; 528/155, 156; 525/480, 501

[56] References Cited

U.S. PATENT DOCUMENTS

| | | | |
|---|---|---|---|
| 4,377,631 | 3/1983 | Toukhy | 430/192 |
| 4,529,682 | 7/1985 | Toukhy | 430/190 |
| 4,555,469 | 11/1985 | Erdmann et al. | 430/165 |
| 4,587,196 | 5/1986 | Toukhy | 430/192 |
| 4,731,319 | 3/1988 | Kohara et al. | 430/192 |
| 4,837,121 | 6/1989 | Blakeney et al. | 430/192 |
| 4,959,292 | 9/1990 | Blakeney et al. | 430/165 |
| 4,970,287 | 11/1990 | Blakeney et al. | 528/212 |
| 5,001,040 | 3/1991 | Blakeney et al. | 430/326 |
| 5,024,921 | 6/1991 | Blakeney et al. | 430/326 |
| 5,053,479 | 10/1991 | Blakeney et al. | 528/129 |
| 5,145,763 | 9/1982 | Bassett et al. | 430/169 |
| 5,196,289 | 3/1993 | Jeffries, III et al. | 430/192 |
| 5,235,022 | 8/1993 | Jeffries, III et al. | 430/192 |
| 5,238,776 | 8/1993 | Zampini | 430/192 |
| 5,413,894 | 5/1995 | Sizensky et al. | 430/165 |

FOREIGN PATENT DOCUMENTS

| | | |
|---|---|---|
| 118291 | 9/1984 | European Pat. Off. |
| 273026 | 6/1988 | European Pat. Off. |
| 9103769 | 3/1991 | WIPO |
| 9104512 | 4/1991 | WIPO |

OTHER PUBLICATIONS

Templeton et al. "On the Dissolution Kinetics of Positive Photoresists The Secondary Structure Model", SPIE vol. 771, Advances in Resist Technology and Processing IV (1987) pp. 136–147.

Hanabata et al "High Resolution Positive Photoresists", SPIE vol. 631, Advances in Resist Technology and Processing III (1986.

*Primary Examiner*—John S. V. Chu
*Attorney, Agent, or Firm*—William A. Simons

[57] ABSTRACT

A phenolic novolak composition prepared by a process comprising the steps of:

(1) reacting a first phenolic monomer comprising a major portion of at least one trifunctional phenolic monomer with a first aldehyde source in the absence of a catalyst at a reaction temperature from about 100° C. to about 200° C. and at a reaction pressure of about 2 to about 15 atmospheres to form a phenolic oligomer having a weight average molecular weight from about 500 to about 2,000, having ortho-ortho bonding of about 55% to about 75% of the methylene bonds between the phenolic moieties; and having a time to clear of less than 125 seconds per micron; wherein the mole ratio of said first aldehyde source to said first phenolic monomer is from about 0.3:1.0 to about 0.55:1.0; and (2) then reacting said oligomer with an optional second phenolic source and a second aldehyde source at a temperature from about 80° C. to about 150° C. to form a phenolic novolak having a weight average molecular weight of 3,000 to 40,000, having ortho-ortho bonding of between 50% and 70% of the methylene bonds between the phenolic moieties, and having a time to clear of at least 20 seconds per micron; wherein the mole ratio of said second aldehyde source to said total phenolic moieties is less than about 0.8:1.0.

12 Claims, No Drawings

HIGH ORTHO-ORTHO BONDED NOVOLAK BINDER RESINS AND THEIR USE IN A PROCESS FOR FORMING POSITIVE RESIST PATTERNS

This application is a division of U.S. application Ser. No. 08/057,999 filed May 7, 1993, now U.S. Pat. No. 5,413,894, which is incorporated herein by reference in its entirety.

BACKGROUND OF THE INVENTION

1. Field of the Invention

This invention relates to selected novolaks prepared via a two-stage process which contain high levels of ortho-ortho methylene bridge bonding. In the first stage, a low molecular weight oligomeric prepolymer with high ortho-ortho bonding is formed via a noncatalyzed reaction of phenolic monomers with an aldehyde source under elevated temperatures and pressures. In the second stage, the oligomeric prepolymer is extended to higher molecular weights to obtain a novolak resin with desirable alkaline solubility, molecular weight and ortho-ortho bonding properties. These novolaks can also be fractionated to further improve their lithographic properties.

Furthermore, the present invention relates to radiation-sensitive compositions useful as positive-working photoresist compositions, particularly those containing these phenolic resins and o-quinonediazide photosensitizers. Still further, the present invention also relates to substrates coated with these radiation-sensitive compositions as well as the processes of coating, imaging, and developing these radiation-sensitive mixtures on these substrates.

2. Description of Related Art Including Information Disclosed Under 37 CFR §§ 1.97–1.99

Photoresist compositions are used in microlithographic processes for making miniaturized electronic components such as in the fabrication of integrated circuits and printed wiring board circuitry. Generally, in these processes, a thin coating or film of a photoresist composition is first applied to a substrate material, such as silicon wafers used for making integrated circuits or aluminum or copper plates of printed wiring boards. The coated substrate is then baked to evaporate any solvent in the photoresist composition and to fix the coating onto the substrate. The baked coated surface of the substrate is next subjected to an image-wise exposure of radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate. In some instances, it may be desirable to bake the imaged coated substrate after the imaging step and before the developing step. This bake step is commonly called a post-exposure bake and is used to increase resolution.

There are two types of photoresist compositions—negative-working and positive-working. When negative-working photoresist compositions are exposed image-wise to radiation, the areas of the resist composition exposed to the radiation become less soluble to a developer solution (e.g., a cross-linking reaction occurs) while the unexposed areas of the photoresist coating remain relatively soluble to a developing solution. Thus, treatment of an exposed negative-working resist with a developer solution causes removal of the nonexposed areas of the resist coating and the creation of a negative image in the photoresist coating, and thereby uncovering a desired portion of the underlying substrate surface on which the photoresist composition was deposited. On the other hand, when positive-working photoresist compositions are exposed image-wise to radiation, those areas of the resist composition exposed to the radiation become more soluble to the developer solution (e.g., a rearrangement reaction occurs) while those areas not exposed remain relatively insoluble to the developer solution. Thus, treatment of an exposed positive-working resist with the developer solution causes removal of the exposed areas of the resist coating and the creation of a positive image in the photoresist coating. Again, a desired portion of the underlying substrate surface is uncovered.

After this development operation, the now partially unprotected substrate may be treated with a substrate-etchant solution or plasma gases and the like. This etchant solution or plasma gases etch the portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining resist layer after the development step and before the etching step to increase its adhesion to the underlying substrate and its resistance to etching solutions.

Positive-working photoresist compositions are currently favored over negative-working resists because the former generally have better resolution capabilities and pattern transfer characteristics.

Photoresist resolution is defined as the smallest feature which the resist composition can transfer from the photomask to the substrate with a high degree of image edge acuity after exposure and development. In many manufacturing applications today, resist resolution on the order of one-half micron or less is necessary.

In addition, it is generally desirable that the developed photoresist wall profiles be near vertical relative to the substrate. Such demarcations between developed and undeveloped areas of the resist coating translate into accurate pattern transfer of the mask image onto the substrate.

Increased resolution has been noted in positive photoresist systems whose novolaks possess a high degree of ortho-ortho bonding. The term ortho-ortho bonding is used to refer to the location and positions of attachment of the methylene bridge between phenolic nuclei. Thus, the bridge which connects two phenolic nuclei which is ortho to both phenolic hydroxyl groups is regarded as ortho-ortho.

It is thought that ortho-ortho bonding increases the interactions between the novolak and the photoactive compound in positive photoresists compared to positive photoresists containing novolaks which lack a high degree of ortho-ortho bonding in their microstructure. Although the exact character of these interactions is speculative, e.g., hydrogen bonding, van der Waals forces, and the like, there is a correlation between increased resolution and contrast observed in these positive resists whose novolaks contain a high degree of ortho-ortho bonding compared to positive resists whose novolaks lack this high degree of ortho-ortho bonding.

In a conventional novolak system such as m-/p-cresol novolak, as the p-cresol content is increased, the ortho-ortho bonding increases. This leads to increased inhibition and discrimination and ultimately results in higher resolution. However, beyond a certain level, the extra p-cresol typically results in scum formation between resist images and a slowing of the photospeed. This renders the photoresist unusable.

European Patent Application 0118291, published on Dec. 9, 1984, and Hanabata et al., SPIE Vol. 631, pages 76–82 (1986) describe the synthesis of preparing high ortho-ortho novolaks by polymerizing m-cresol and formaldehyde with a divalent metal catalyst. This method circumvents the above-noted tradeoffs which exist with novolaks made from high content p-cresol phenolic mixtures.

Separately, Casiraghi et al. (makromol. Chem. 182 (11), 2973, 1981 describes a procedure to prepare high ortho-ortho novolaks by a noncatalyzed process. However, this paper did not report using this procedure with m-cresol or a mixture of m-p-cresol monomer feeds.

The present invention differs from these teachings and prepares unique high ortho-ortho novolaks which are mainly made from phenolic monomer feeds which are mainly trifunctional (e.g., m-cresol or 3,5-xylenol). These high ortho-ortho novolaks which when formulated into resists, impart high resolution and sensitivity.

The prior art also replete with numerous other references which teach the making of specific novolak resins useful in radiation-sensitive mixtures. Such references include U.S. Pat. Nos. 4,377,631 (Toukhy); 4,529,683 (Toukhy); 4,587,196 (Toukhy); 4,837,121 (Blakeney et al.); 4,959,293 (Blakeney et al.); 4,970,287 (Blakeney et al.); 5,053,479 (Blakeney et al.); 5,024,921 (Blakeney et al.); and 5,196,289 (Jeffries et al) as well as published PCT Patent Applications Nos. PCT/US90/04307 (Jeffries et al.); and PCT/US90/03601 (Ebersole).

SUMMARY OF THE INVENTION

One aspect of the present invention is directed to a process for preparing novolak resins having a high level of ortho-ortho bonding comprising the steps of:

(1) reacting a first phenolic monomer comprising a major proportion of at least one trifunctional phenolic monomer with a first aldehyde source in the absence of a catalyst at a reaction temperature from about 100° C. to about 200° C. and at a reaction pressure of about 2 to about 15 atmospheres to form a phenolic oligomer having a weight average molecular weight from about 500 to about 2,000, having ortho-ortho bonding of about 55–75% of the methylene bonds between the phenolic moieties, and having a time to clear of less than about 125 seconds per micron; wherein the mole ratio of said first aldehyde source to said first phenolic monomer from about 0.3:1.0 to about 0.55:1.0; and (2) then reacting said oligomer with an optional second phenolic monomer and a second aldehyde source at a temperature from about 80° C. to about 150° C. to form a phenolic novolak having a weight average molecular weight of 3,000 to 40,000; having ortho-ortho bonding of between 55% to 70% of the methylene bonds between the phenolic moieties; and having a time to clear of at least 20 seconds per micron; wherein the mole ratio of second aldehyde source to the total phenolic moieties in said oligomer and second phenolic monomers is less than about 0.8:1; and Another aspect of the present invention is directed to a phenolic novolak composition, novel compositions of matter, having a weight average molecular weight from 3,000 to 40,000, having ortho-ortho bonding of between 55% and 70% of the methylene bonds between the phenolic moieties in the novolak and having time to clear of at least 20 seconds per micron, and prepared according to the above-noted process.

Moreover, the present invention is directed to a radiation-sensitive composition useful as a positive photoresist comprising an admixture of a photoactive o-quinonediazide compound and the novolak binder resin as described above; the amount of said o-quinonediazide compound or compounds being about 5% to about 40% by weight and the amount of said binder resin being about 60 to 95% by weight, based on the total solid content of said radiation-sensitive composition.

Also further, the present invention encompasses said coated substrates (both before and after imaging) as novel articles of manufacture.

Still further, the present invention also encompasses the process of coating substrates with these radiation-sensitive compositions and then imaging and developing these coated substrates.

DESCRIPTION OF THE PREFERRED EMBODIMENTS

The high ortho-ortho oligomeric prepolymer prepared by the first step of the present invention is made by reacting a phenolic monomer source (a major proportion of which is a trifunctional phenolic monomer) with an aldehyde source in the absence of a catalyst at a certain elevated temperature range and at certain elevated pressures. Preferably, this reaction is carried out in the presence of a solvent.

As mentioned above, the phenolic source is made of a major proportion (i.e., at least 50% by moles) of a trifunctional phenolic monomer. Preferably, the phenol source is at least 75% by moles of a trifunctional phenolic monomer. Most preferably, the phenol source is 100% by moles of a trifunctional phenolic monomer. Suitable trifunctional phenolic monomers include m-cresol and 3,5-dimethyl phenol. Trifunctional phenolic sources are those phenolic monomers whose three reactive sites on the phenolic ring (i.e., the two ortho positions and the para position) are unsubstituted. Thus, these trifunctional phenolic sources have three available reaction sites.

A minority amount of the phenolic source for the oligomer may be difunctional or monofunctional phenolic sources. Examples of difunctional phenolic sources include o-cresol, p-cresol, 2,3-dimethylphenol, 2,5-dimethylphenol, and 3,4-dimethylphenol. Difunctional phenolic sources have two of the three available reaction sites for reaction on the phenolic ring. Examples of monofunctional phenolic sources include 2,4-dimethylphenol and 2,6-dimethylphenol. Monofunctional phenolic sources have one of the three available reaction sites for reaction on the phenolic ring.

Any aldehyde source may be used for making the oligomer. Paraformaldehyde is the preferred aldehyde source. Formalin is less preferred because of its water content. Other formaldehyde sources, such as trioxane, may be used.

As mentioned above, no catalyst is added when making the oligomer. The phenolic monomers self-catalyze the reaction at the elevated temperatures and pressures employed in the present inventive process. The aldehyde to phenolic monomer mole ratio for this oligomer-forming reaction may preferably range from about 0.35:1.0 to about 0.5:1.0. More preferably, this mole ratio is from about 0.40:1.0 to about 0.47:1.0. Too little aldehyde in this step results insufficient ortho-ortho bonding. Too much aldehyde added to this first step will result in an insoluble product.

The reaction temperatures for making the oligomer are from about 100° C. to about 200° C. At temperatures lower than about 100° C., longer reaction times are required and the level of ortho-ortho bonding suffers. At temperatures higher than 200° C., the reaction pressure may increase uncontrollably. The preferred temperature range is 125° C. to 175° C. The preferred reaction pressure should be from 2.2 to about 6 atmospheres. More preferable is about 2.5 to about 4.5 atmospheres. This increased reaction pressure is necessary to keep the reactants, especially the aldehyde source, within the reactor vessel and to allow for the self-catalyzed reaction to occur.

The oligomer-forming reaction is carried out for a sufficient amount of time to bring the reaction to completion. The preferred weight average molecular weight ($M_w$) for the oligomer is 700 to 1,500. Too high aldehyde to phenol ratio forms novolak polymer chains in excess of these molecular weights.

The oligomer-forming reaction is preferably carried out in the presence of a solvent. Any solvent which is commonly used in phenolic novolak resin-forming reactions may be used. Examples include xylene, 1-methoxy-2-propanol, propylene glycol monomethyl ether acetate, methyl 3-methoxy propionate, ethyl 3-ethoxy propionate, ethyl lactate, ethyl cellosolve acetate, and diglyme. One preferred solvent is xylene. It should be understood that this oligomer-forming reaction could be carried out without a solvent.

The amount of solvent, if used should be sufficient to dissolve the reactants. Preferably, the amount of solvent may range from about 25% to about 100% or greater by weight, based on the total amount of reactants employed.

An ortho-ortho bond between phenolic groups formed by reaction of 2 trifunctional phenolic compounds such as meta-cresol is illustrated by the following structure (A):

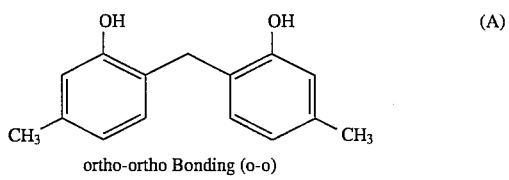

ortho-ortho Bonding (o-o)

Non-ortho-ortho bonds formed by the reaction of the same trifunctional phenolic compound is illustrated by the following structures (B) and (C):

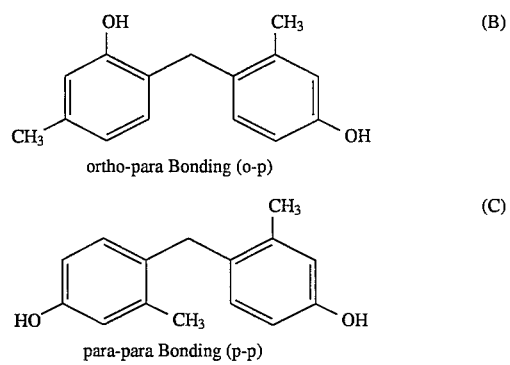

ortho-para Bonding (o-p)

para-para Bonding (p-p)

It has been found that an oligomeric-forming reaction under the above-described conditions which results in about 55% to about 75% of ortho-ortho bonding between methylene groups and the phenolic groups and a time to clear less than 125, preferably less than 15, seconds per micron will produce a novolak resin with highly desirable performance characteristics.

This oligomer-forming reaction is illustrated by the following chemical reaction:

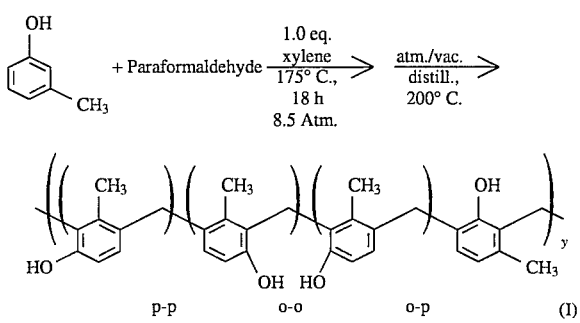

where 55% to 75% of the methylene bridges are otho-ortho bonded and Y is a positive integer After the oligomeric reaction is over, the resultant oligomer is preferably isolated from reaction mixture by any conventional means. One method is vacuum distilling off any unreacted phenolic monomers and aldehyde along with the solvent. This may be carried out at a temperature from 170° C. to about 250° C.

The phenolic novolaks of the present invention may be then made by reacting the prepared oligomers with a second aldehyde source and with a second phenolic monomer source.

If the second phenolic source is merely the oligomer (i.e., no additional phenolic monomer is added) the oligomer is extended by reacting separate oligomeric chains with the second aldehyde.

Any conventional aldehyde source may be used for this novolak-forming step. Formalin or paraformaldehyde are the preferred aldehyde sources. Other formaldehyde sources, such as trioxane and hexamethylenetetramine (HMTA), can also be used. Other aldehyde sources such as chloroacetaldehyde diethyl acetal can be used.

If the oligomer is extended with the combination of a different phenolic monomer and a second aldehyde source, the second phenolic source may be any trifunctional, difunctional, or monofunctional phenolic monomer. The preferred second phenolic source is para-cresol or a mixture of para-cresol and meta-cresol (10:90 to 90:10 mole ratios).

Oxalic acid is the preferred acid catalyst this second step reaction because of its ease of removal by decomposition in the work-up. However, any other acid catalyst that is typically used to prepare novolaks can be used in this reaction. Also, this novolak forming polymerization reaction may proceed without a catalyst, especially if paraformaldehyde or hexamethylene tetramine (HMTA) is used.

Preferred mole ratios of the second aldehyde source to the total phenolic moieties in the oligomer and second phenolic source are from 0.1:1 to about 0.7:1.

Reaction temperatures for this novolak-forming reaction are from about 80° C. to about 150° C. The preferred range is from about 90° C. to about 120° C.

The novolak-forming reaction is preferably carried out without a solvent. Alternatively, any solvent conventionally used to form novolaks may be used. Suitable solvents may include propylene glycol monomethyl ether acetate, methyl 3-methoxy propionate, ethyl 3-ethoxy propionate, ethyl lactate, ethyl cellosolve acetate, diglyme, and the like.

The novolaks formed by this reaction have a weight average molecular weight ($M_w$) range from about 3,000 to about 40,000, preferably 3,000 to 10,000. They are also characterized by having ortho-ortho bonds from about 55% to 70%, preferably from about 60% to about 65% and having a time to clear of at least 20 seconds per micron, preferably about 25 to about 1000 seconds per micron.

This novolak forming reaction is illustrated by the following reaction equations (II) and (III):

Without an additional phenolic source:

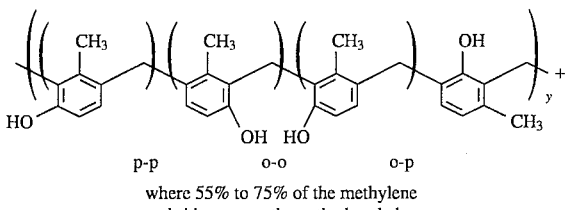

where 55% to 75% of the methylene
bridges are ortho-ortho bonded

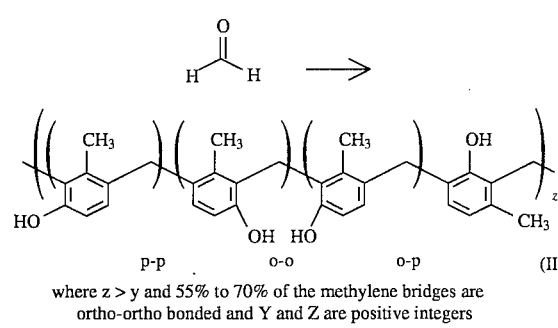

where z > y and 55% to 70% of the methylene bridges are
ortho-ortho bonded and Y and Z are positive integers (II)

With an additional phenolic source:

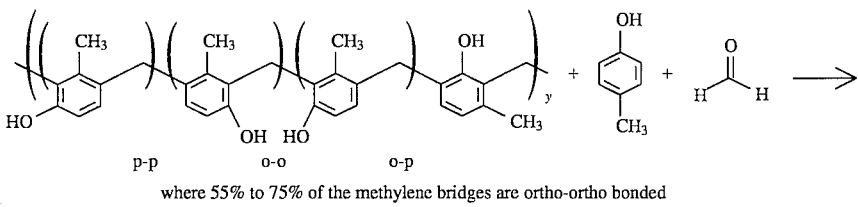

where 55% to 75% of the methylene bridges are ortho-ortho bonded

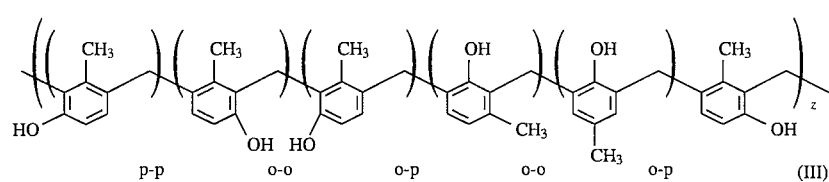

where z > y and 55% to 70% of the methylene bridges are ortho-ortho bonded
and Y and Z are positive integers (III)

The above novolak resins are preferably isolated from the reaction mixture. Any conventional isolation technique may be used. A preferred isolation method is distillation.

These novolak resins may be fractionated to remove low molecular weight fractions (e.g., 90% of those fractions having $M_w$ under 500) Resists based on such fractionated novolaks may have improved lithographic performance including high thermal flow resistance. Any conventional novolak fractionation method may be employed. A preferred fractionation technique is liquid phase separation or extraction employing more than one solvent. For example, the novolak may first be dissolved in a solvent such as acetone. This solution may then be added to a second less polar solvent (e.g. hexane), mixed therewith and allowed to stand. The novolak solution separates into two separate liquid phases—a high molecular weight fraction and a low molecular weight fraction. These layers are then separated and the desired high molecular weight novolak is recovered by standard isolation techniques such as distillation.

The above discussed novolak resins of the present invention may be mixed with photoactive compounds to make radiation-sensitive mixtures were are useful as positive acting photoresists. The preferred class of photoactive compounds (sometimes called sensitizers) is o-quinonediazide compounds particularly esters derived from polyhydric phenols, alkyl-polyhydroxyphenones, aryl-polyhydroxyphenones, and the like which can contain up to six or more sites for esterification. The most preferred o-quinonediazide esters are derived from o-naphthoquinone-(1,2)-diazide-4-sulfonic acid and o-naphthoquinone-(1,2) diazide-5-sulfonic acid.

Specific examples include resorcinol 1,2-naphthoquinonediazide-4-sulfonic acid esters; pyrogallol 1,2-naphthoquinonediazide-5-sulfonic acid esters, 1,2-quinonediazidesulfonic acid esters of (poly)hydroxyphenyl alkyl ketones or (poly)hydroxyphenyl aryl ketones such as 2,4-dihydroxyphenyl propyl ketone 1,2-benzoquinonediazide-4-sulfonic acid esters, 2,4,dihydroxyphenyl hexyl ketone 1,2-naphthoquinonediazide-4-sulfonic acid esters, 2,4-dihydroxybenzophenone 1,2-naphthoquinonediazide-5-sulfonic acid esters, 2,3,4-trihydroxyphenyl hexyl ketone, 1,2-naphthoquinonediazide-4-sulfonic acid esters, 2,3,4-trihydroxybenzophenone 1,2-naphthoquinonediazide-4-sulfonic acid esters, 2,3,4-trihydroxybenzophenone 1,2-naphthoquinonediazide-5-sulfonic acid esters, 2,4,6-trihydroxybenzophenone 1,2-naphthoquinonediazide- 4-sulfonic acid esters, 2,4, 6-trihydroxybenzophenone 1,2-naphthoquinonediazide-5-sulfonic acid esters, 2,3,4,4'-tetrahydroxybenzophenone 1,2-naphthoquinonediazide-5-sulfonic acid esters, 2,3,4,4'-tetrahydroxybenzophenone 1,2-naphthoquinonediazide-4-sulfonic acid esters, 2,2',3,4',6'-pentahydroxybenzophenone 1,2-naphthoquinonediazide-5-sulfonic acid esters, and 2,3,3',4,4',5'-hexahydroxybenzophenone 1,2-naphthoquinonediazide-5-sulfonic acid esters; 1,2-quinonediazidesulfonic acid esters of bis[(poly)hydroxyphenyl]alkanes such as bis(p-hydroxyphenyl)-methane 1,2-naphthoquinonediazide-4-sulfonic acid esters, bis(2,4-dihydroxyphenyl)methane 1,2-naphthoquinonediazide- 5-sulfonic acid esters, bis(2,3, 4-trihydroxyphenyl)methane 1,2-naphthoquinonediazide-5-sulfonic acid esters, 2,2-bis(p-hydroxyphenyl)propane 1,2-naphthoquinonediazide-4-sulfonic acid esters, 2,2-bis(2,4-dihydroxyphenyl)propane 1,2-naphthoquinonediazide-5-sulfonic acid esters, and 2,2-bis(2,3,4-trihydroxyphenyl)propane 1,2-naphthoquinonediazide-5-sulfonic acid esters. Besides the 1,2-quinonediazide compounds exemplified above, there can also be used the 1,2-quinonediazide compounds described in J. Kosar, "Light-Sensitive Systems", 339–352 (1965), John Wiley & Sons (New York) or in S. DeForest, "Photoresist", 50, (1975), MacGraw-Hill, Inc. (New York). In addition, these materials may be used in combinations of two or more. Further, mixtures of substances formed when less than all esterification sites present on a particular polyhydric phenol, alkyl-polyhydroxyphenone, aryl-polyhydroxyphenone, and the like have combined with o-quinonediazides may be effectively utilized in positive acting photoresists.

Of all the 1,2-quinonediazide compounds mentioned above, 1,2-naphthoquinonediazide-5-sulfonic acid di-, tri-, tetra-, penta-, and hexa-esters of polyhydroxy compounds having at least 2 hydroxyl groups, i.e., about 2 to 6 hydroxyl groups, are most preferred. These 1,2-quinonediazide compounds may be used alone or in combination of two or more.

The proportion of the sensitizer compound in the radiation-sensitive mixture may preferably range from about 5 to about 40%, more preferably from about 10 to about 25% by weight of the nonvolatile (e.g., nonsolvent) content of the radiation-sensitive mixture. The proportion of total binder resin of this present invention in the radiation-sensitive mixture may preferably range from about 60% to about 95%, more preferably, from about 75 to 90% of the nonvolatile (e.g., excluding solvents) content of the radiation-sensitive mixture.

These radiation-sensitive mixtures may also contain conventional photoresist composition ingredients such as other resins, solvents, actinic and contrast dyes, anti-striation agents, plasticizers, speed enhancers, and the like. These additional ingredients may be added to the binder resin and sensitizer solution before the solution is coated onto the substrate.

Other binder resins may also be added beside the resins of the present invention mentioned above. Examples include phenolic-formaldehyde resins, cresolformaldehyde resins, phenol-cresol-formaldehyde resins and polyvinylphenol resins commonly used in the photoresist art. If other binder resins are present, they may account for up to 50% by weight of the total binder resins in the radiation sensitive mixtures. Thus, the total amount of the binder resin in the radiation-sensitive composition will be from about 60% to about 95% by weight of the total nonvolatile solids content of the radiation-sensitive composition.

The resins and sensitizers may be dissolved in a solvent or solvents to facilitate their application to the substrate. Examples of suitable solvents include methoxyacetoxy propane, ethyl cellosolve acetate, n-butyl acetate, diglyme, ethyl lactate, ethyl 3-ethoxy propionate, methyl 3-methyl propionate, propylene glycol alkyl ether acetates, or mixtures thereof and the like. The preferred amount of solvent may be from about 50% to about 500%, or higher, by weight, more preferably, from about 100% to about 400% by weight, based on combined resin and sensitizer weight.

Actinic dyes help provide increased resolution on highly reflective surfaces by inhibiting back scattering of light off the substrate. This back scattering causes the undesirable effect of optical notching, especially on a substrate topography.

Examples of actinic dyes include those that absorb light energy at approximately 400–460 nm [e.g., Fat Brown B (C.I. No. 12010); Fat Brown RR (C.I. No. 11285); 2-hydroxy-1,4-naphthoquinone (C.I. No. 75480) and Quinoline Yellow A (C.I. No. 47000)] and those that absorb light energy at approximately 300–340 nm [e.g., 2,5-diphenyloxazole (PPO-Chem. Abs. Reg. No. 92-71-7) and 2-(4-biphenyl)-6-phenylbenzoxazole (PBBO-Chem. Abs. Reg. No. 17064-47-0)]. The amount of actinic dyes may be up to 10% weight levels, based on the combined weight of resin and sensitizer.

Contrast dyes enhance the visibility of the developed images and facilitate pattern alignment during manufacturing. Examples of contrast dye additives that may be used together with the radiation-sensitive mixtures of the present invention include Solvent Red 24 (C.I. No. 26105), Basic Fuchsin (C.I. 42514), Oil Blue N (C.I. No. 61555), and Calco Red A (C.I. No. 26125) up to 10% weight levels, based on the combined weight of resin and sensitizer.

Anti-striation agents or leveling agents level out the resist coating or film to a uniform thickness. In other words, the leveling agent is used to eliminate the formation of striations on the surface of the resist coating once the coating is spun onto the substrate surface. Anti-striation agents may be used up to 5% weight levels, based on the weight of solids in the resist formulation. One suitable class of antistriation agents is nonionic silicon-modified polymers. A preferred one is TROYKYD 366 made by Troy Chemical Co., Newark, N.J. Another suitable class of antistriation agents is fluoroaliphatic polymeric ester surfactants. A preferred one is FC-430 FLUORAD made by 3M of St. Paul, Minn. Nonionic surfactants may also be used for this purpose, including, for example nonylphenoxy poly(ethyleneoxy) ethanol; octylphenoxy (ethyleneoxy) ethanol; and dinonyl phenoxy poly(ethyleneoxy) ethanol; polyoxyethylene lauryl ether; polyoxyethylene oleyl ether; polyoxyethylene octylphenyl ether; polyoxyethylene nonylphenyl ether; polyoxyethylene glycol dilaurate; and polyoxyethylene glycol distearate. Also may be useful are organosiloxane polymers and acrylic acid-containing or methacrylic acid-containing polymers.

Plasticizers improve the coating and adhesion properties of the photoresist composition and better allow for the application of a thin coating or film of photoresist which is smooth and of uniform thickness onto the substrate. plasticizers which may be used include, for example, phosphoric acid tri-(B-chloroethyl)-ester; stearic acid; dicamphor; polypropylene; acetal resins; phenoxy resins; and alkyl resins up to 10% weight levels, based on the combined weight of resin and sensitizer.

Speed enhancers tend to increase the solubility of the photoresist coating in both the exposed and unexposed areas, and thus, they are used in applications where speed of development is the overriding consideration even though some degree of contrast may be sacrificed, i.e., in positive resists while the exposed areas of the photoresist coating will be dissolved more quickly by the developer, the speed enhancers will also cause a larger loss of photoresist coating from the unexposed areas. Speed enhancers that may be used include, for example, picric acid, nicotinic acid, or nitrocinnamic acid as well as polyhydroxyphenolic compounds such as hexakis(4-hydroxyphenyl)-1,3,5-triethylbenzene at weight levels of up to 20%, based on the combined weight of resin and sensitizer.

The prepared radiation-sensitive resist mixture, can be applied to a substrate by any conventional method used in the photoresist art, including dipping, spraying, whirling, and spin coating. When spin coating, for example, the resist mixture can be adjusted as to the percentage of solids content in order to provide a coating of the desired thickness given the type of spinning equipment and spin speed utilized and the amount of time allowed for the spinning process. Suitable substrates include silicon, aluminum, polymeric resins, silicon dioxide, doped silicon dioxide, silicon resins, gallium arsenide, silicon nitride, tantalum, copper, polysilicon, ceramics, and aluminum/copper mixtures.

The photoresist coatings produced by the above described procedure are particularly suitable for application to thermally-grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters and polyolefins.

After the resist solution is coated onto the substrate, the coated substrate is baked at approximately 70° C. to 125° C. until substantially all the solvent has evaporated and only a uniform radiation-sensitive coating remains on the substrate.

The coated substrate can then be exposed to radiation, especially ultraviolet radiation, in any desired exposure pattern, produced by use of suitable masks, negatives, stencils, templates, and the like. Conventional imaging process or apparatus currently used in processing photoresist-coated substrates may be employed with the present invention. In some instances, a post-exposure bake at a temperature about 10° C. higher than the softbake temperature is used to enhance image quality and resolution.

The exposed resist-coated substrates are next developed in an aqueous alkaline developing solution. This solution is preferably agitated, for example, by nitrogen gas agitation. Examples of aqueous alkaline developers include aqueous solutions of tetramethylammonium hydroxide, sodium hydroxide, potassium hydroxide, ethanolamine, choline, sodium phosphates, sodium carbonate, sodium metasilicate, and the like. The preferred developers for this invention are aqueous solutions of either alkali metal hydroxides, phosphates or silicates, or mixtures thereof, or tetramethylammonium hydroxide.

Alternative development techniques such as spray development or puddle development, or combinations thereof, may also be used.

The substrates are allowed to remain in the developer until all of the resist coating has dissolved from the exposed areas. Normally, development times from about 10 seconds to about 3 minutes are employed.

After selective dissolution of the coated wafers in the developing solution, they are preferably subjected to a deionized water rinse to fully remove the developer or any remaining undesired portions of the coating and to stop further development. This rinsing operation (which is part of the development process) may be followed by blow drying with filtered air to remove excess water. A post-development heat treatment or bake may then be employed to increase the coating's adhesion and chemical resistance to etching solutions and other substances. The post-development heat treatment can comprise the baking of the coating and substrate below the coatings thermal deformation temperature.

In industrial applications, particularly in the manufacture of microcircuitry units on silicon/silicon dioxide-type substrates, the developed substrates may then be treated with a buffered, hydrofluoric acid etching solution or plasma gas etch. The resist compositions of the present invention are believed to be resistant to a wide variety of acid etching solutions or plasma gases and provide effective protection for the resist-coated areas of the substrate.

Later, the remaining areas of the photoresist coating may be removed from the etched substrate surface by conventional photoresist stripping operations.

The present invention is further described in detail by means of the following Examples and Comparative Examples. All parks and percentages are by weight and all temperatures are degrees Celsius unless explicitly stated otherwise.

EXAMPLES 1–12 AND COMPARATIVE
EXAMPLE 1 OLIGOMER FORMATION

Example 1

A novolak oligomer was prepared in a 600 mL Parr pressure reactor by the condensation of m-cresol and paraformaldehyde. Thus, m-cresol (172.8 g, 1.6 moles), xylene (216 g) and paraformaldehyde (95% by weight purity) (20.2 g., 0.64 moles) was added to the reactor. The reactor was sealed and the homogeneous mixture was stirred at 300 rpm. The mixture was heated to 175° C. over a period of 45 minutes. The reaction was kept at 175° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, 103.6 g of light yellow, glassy polymer were isolated. All reaction charges are summarized in Table I. All oligomeric characteristics are summarized in Table II.

Example 2

A novolak oligomer was prepared in a 600 mL Parr pressure reactor by the condensation of m-cresol and paraformaldehyde. Thus, m-cresol (216.0 g, 2.0 moles), xylene (216 g) and paraformaldehyde (95%) (28.4 g., 0.90 moles) was added to the reactor. The reactor was sealed and the homogeneous mixture was stirred at 300 rpm. The mixture was heated to 175° C. over a period of 45 minutes. The reaction was kept at 175° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, 143.7 g of light yellow glassy novolak oligomer was isolated. All reaction charges are summarized in Table I. All oligomeric characteristics are summarized in Table II.

Example 3

A novolak oligomer was prepared in a 600 mL Parr pressure reactor by the condensation of m-cresol and paraformaldehyde. Thus, m-cresol (108.0 g, 1.0 moles), xylene (108 g) and paraformaldehyde (95%) (15.8 g., 0.50 moles) was added to the reactor. The reactor was sealed and the homogeneous mixture was stirred at 300 rpm. The mixture was heated to 175° C. over a period of 45 minutes. The reaction was kept at 175° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, 70.1 g of light yellow, glassy oligomer was isolated. All reaction charges are summarized in Table I. All oligomeric characteristics are summarized in Table II.

Example 4

A novolak oligomer was prepared in a 600 mL Parr pressure reactor by the condensation of m-cresol and paraformaldehyde. Thus, m-cresol (216.0 g, 2.0 moles), xylene (216 g) and paraformaldehyde (95%) (28.4 g., 0.90 moles) was added to the reactor. The reactor was sealed and the homogeneous mixture was stirred at 300 rpm. The mixture was heated to 150° C. over a period of 45 minutes. The reaction was kept at 150° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, 142 g of light yellow, glassy oligomer was isolated. All reaction charges are summarized in Table I. All oligomeric characteristics are summarized in Table II.

Example 5

A novolak oligomer was prepared in a 600 mL Parr pressure reactor by the condensation of m-cresol and paraformaldehyde. Thus, m-cresol (216.0 g, 2.0 moles), xylene (216 g) and paraformaldehyde (95%) (29.1 g., 0.92 moles) was added to the reactor. The reactor was sealed and the homogeneous mixture was stirred at 300 rpm. The mixture was heated to 150° C. over a period of 45 minutes. The reaction was kept at 150° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, a light yellow, glassy oligomer was isolated. All reaction charges are summarized in Table I. All oligomeric characteristics are summarized in Table II.

Example 6

A novolak oligomer was prepared in a 600 mL Parr pressure reactor by the condensation of m-cresol and paraformaldehyde. Thus, m-cresol (216.0 g, 2.0 moles), xylene (216 g) and paraformaldehyde (95%) (30.3 g., 0.96 moles) was added to the reactor. The reactor was sealed and the homogeneous mixture was stirred at 300 rpm. The mixture was heated to 150° C. over a period of 45 minutes. The reaction was kept at 150° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, a light yellow, glassy oligomer was isolated. All reaction charges are summarized in Table I. All oligomeric characteristics are summarized in Table II.

Example 7

A novolak oligomer was prepared in a 600 mL Parr pressure reactor by the condensation of m-cresol and paraformaldehyde. Thus, m-cresol (108.0 g, 2.0 moles), propylene glycol methyl ether acetate (108 g) and paraformaldehyde (95%) (14.2 g., 0.45 moles) was added to the reactor. The reactor was sealed and the homogeneous mixture was stirred at 300 rpm. The mixture was heated to 175° C. over a period of 45 minutes. The reaction was kept at 175° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, 65.7 grams of light yellow, glassy novolak oligomer was isolated. All reaction charges are summarized in Table I. All oligomeric characteristics are summarized in Table II.

Example 8

A novolak oligomer was prepared in a 600 mL Parr pressure reactor by the condensation of m-cresol and paraformaldehyde. Thus, m-cresol (216.0 g, 2.0 moles), propylene glycol methyl ether acetate (216 g) and paraformaldehyde (95%) (29.1 g., 0.92 moles) was added to the reactor. The reactor was sealed and the homogeneous mixture was stirred at 300 rpm. The mixture was heated to 150° C. over a period of 45 minutes. The reaction was kept at 150° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, a light yellow, glassy novolak oligomer was isolated. All reaction charges are summarized in Table I. All oligomeric characteristics are summarized in Table II.

Example 9

A novolak oligomer was prepared in a 600 mL Parr pressure reactor by the condensation of m-cresol and paraformaldehyde. Thus, m-cresol (216.0 g, 2.0 moles), propylene glycol methyl ether acetate (216 g) and paraformaldehyde (95%) (30.3 g., 0.96 moles) was added to the reactor. The reactor was sealed and the homogeneous mixture was stirred at 300 rpm. The mixture was heated to 150° C. over a period of 45 minutes. The reaction was kept at 150° C. for 18 hours.

Upon completion of the reaction, the reaction solution was cooled and transferred to a one liter round bottom flask which was fitted for distillation. The solution was heated to 205° C. during which time the solvent and residual m-cresol. distilled at atmospheric pressure. After one hour vacuum was slowly applied over a period of 50 minutes. Full vacuum was applied for one more hour at 205° C.

After cooling, a light yellow, glassy novolak oligomer was isolated. All reaction charges are summarized in Table I. All oligomeric characteristics are summarized in Table II.

Example 10

A novolak oligomer was prepared in a 600 mL Parr pressure reactor by the condensation of m-cresol and paraformaldehyde. Thus, m-cresol (216.0 g, 2.0 moles), propylene glycol methyl ether acetate (216 g) and paraformaldehyde (95%) (31.6 g., 1.00 moles) was added to the reactor. The reactor was sealed and the homogeneous mixture was stirred at 300 rpm. The mixture was heated to 150° C. over a period of 45 minutes. The reaction was kept at 150° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, a light yellow, glassy novolak oligomer was isolated. All reaction charges are summarized in Table I. All oligomeric characteristics are summarized in Table II.

Example 11

A novolak oligomer was prepared in a 600 mL Parr pressure reactor by the condensation of m-cresol and paraformaldehyde. Thus, m-cresol (86.4 g, 0.8 moles), p-cresol (21.6, 0.2 moles), xylene (108 g), and paraformaldehyde (95%) (12.6 g., 0.40 moles) was added to the reactor. The reactor was sealed and the homogeneous mixture was stirred at 300 rpm. The mixture was heated to 175° C over a period of 45 minutes. The reaction was kept at 175° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, 62.7 grams of light yellow, glassy novolak oligomer was isolated. All reaction charges are summarized in Table I. All oligomeric characteristics are summarized in Table II.

Example 12

A novolak oligomer was prepared in a 600 mL Parr pressure reactor by the condensation of m-cresol and paraformaldehyde. Thus, m-cresol (64.8 g, 0.6 moles), p-cresol (43.2, 0.4 moles), xylene (108 g), and paraformaldehyde (95%) (12.6 g., 0.40 moles) was added to the reactor. The reactor was sealed and the homogeneous mixture was stirred at 300 rpm. The mixture was heated to 175° C. over a period of 45 minutes. The reaction was kept at 175° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, 61.3 grams of light yellow, glassy novolak oligomer was isolated. All reaction charges are summarized in Table I. All oligomeric characteristics are summarized in Table II.

Comparative Example 1

A novolak oligomer was prepared in a 600 mL Parr pressure reactor by the condensation of m-cresol and paraformaldehyde using zinc acetate ($ZnOAc_2$), as the ortho-ortho directing catalyst. Thus, m-cresol (108.0 g, 1.0 moles), xylene (108 g), paraformaldehyde (95%) (14.2 g, 0.45 moles), and $ZnOAc_2$ (1.08 g) was added to the reactor. The reactor was sealed and the homogeneous mixture was stirred at 300 rpm. The mixture was heated to 175° C. over a period of 45 minutes. The reaction was kept at 175° C. for 18 hours.

Upon completion of the reaction, the reaction solution was cooled and transferred to a one liter round bottom flask which was fitted for distillation. The solution was heated to 205° C. during which time the solvent and residual m-cresol distilled at atmospheric pressure. After one hour vacuum was slowly applied over a period of 50 minutes. Full vacuum was applied for one more hour at 205° C.

After cooling, 71.1 grams of light yellow, glassy novolak oligomer was isolated. All reaction charges are summarized in Table I. All oligomeric characteristics are summarized in Table II.

TABLE I

HIGH ORTHO-ORTHO m-CRESOL OLIGOMERS
REACTION CHARGE

| Example | Reaction Catalyst | m-Cresol (grams) | p-Cresol (grams) | Solvent Type | Solvent (grams) | 95% paraformaldehyde (grams) | A:P Molar Ratio | Reaction Temp (°C.) |
|---|---|---|---|---|---|---|---|---|
| Self-Catalyzed m-Cresol Oligomers ||||||||||
| 1 | None | 172.8 | 0.0 | xylene | 216.0 | 20.2 | 0.40:1 | 175 |
| 2 | None | 216.0 | 0.0 | xylene | 216.0 | 28.4 | 0.45 | 175 |
| 3 | None | 108.0 | 0.0 | xylene | 108.0 | 15.8 | 0.50 | 175 |
| 4 | None | 216.0 | 0.0 | xylene | 216.0 | 28.4 | 0.45 | 150 |
| 5 | None | 216.0 | 0.0 | xylene | 216.0 | 29.1 | 0.46 | 150 |
| 6 | None | 216.0 | 0.0 | xylene | 216.0 | 30.3 | 0.48 | 150 |
| 7 | None | 108.0 | 0.0 | PM-acetate | 108.0 | 14.2 | 0.45 | 175 |
| 8 | None | 216.0 | 0.0 | PM-acetate | 216.0 | 29.1 | 0.46 | 150 |
| 9 | None | 216.0 | 0.0 | PM-acetate | 216.0 | 30.3 | 0.48 | 150 |
| 10 | None | 216.0 | 0.0 | PM-acetate | 216.0 | 31.6 | 0.50 | 150 |
| Self-Catalyzed m-/p-Cresol Oligomers ||||||||||
| 11 | None | 86.4 | 21.6 | xylene | 108.0 | 12.6 | 0.40 | 175 |

TABLE I-continued

| | | | HIGH ORTHO-ORTHO m-CRESOL OLIGOMERS REACTION CHARGE | | | | | |
|---|---|---|---|---|---|---|---|---|
| Example | Reaction Catalyst | m-Cresol (grams) | p-Cresol (grams) | Solvent Type | Solvent (grams) | 95% paraformaldehyde (grams) | A:P Molar Ratio | Reaction Temp (°C.) |
| 12 | None | 64.8 | 43.2 | xylene | 108.0 | 12.6 | 0.40 | 175 |
| | | | ZnOAc2 Catalyzed m-Cresol Oligomer | | | | | |
| C-1 | ZnOAc$_2$ | 108.0 | 0.0 | xylene | 108.0 | 14.2 | 0.45 | 175 |

Times to Clear

The time to clear ($T_c$) for oligomers and novolaks was measured using a dual channel development rate monitor (DRM). One micron thick films of the polymer were spin cast on silicon wafers. The coatings were developed by immersion in 0.262 N aqueous tetramethylammonium hydroxide solution and the development rate was monitored by the DRM. The $T_c$ is defined as the time in seconds to develop the one micron coating.

Molecular Weights

The molecular weight of the oligomers and novolaks was measured by gel permeation chromatography (GpC) on a phenomenex phenogel 10 four column set (50, 100, 500, and 10,000 A). The elution solvent was tetrahydrofuran and the flow rate was 1.0 mL/min at 35° C. The molecular weights were determined relative to narrow polystyrene standards. The weight average ($M_w$) and number average ($M_n$) molecular weights as well as polymer dispersity ($M_w/M_n$) for these oligomers and polymers are given in Tables 2 and 4 respectively.

Ortho-ortho Bonding

The percent content of ortho-ortho bonding in the oligomers and novolaks was determined by C-NMR spectroscopy. $^{13}$C-NMR spectra were run in deuterated methanol using a 400 MHz Bruker 132-NMR Spectrometer. Tetramethylilane was used as the internal reference. The formula below was used to determine the total ortho-ortho bonding in the oligomers and novolaks.

$$\% \text{ o—o Bonding} = \frac{23.5-32 \text{ ppm}}{23.5-38 \text{ ppm}} \times 100$$

The % ortho-ortho bonding equals 100 times the integration (or area) of the signal of ortho-ortho methylene bridges seen in the range from 23.5 to 32 ppm divided by the total integration (or area) of all methylene bridge signals seen in the range from 23.5 to 38 ppm.

TABLE II

| | High Ortho-Ortho m-Cresol OLIGOMERS Oligomer Characterization | | | | | |
|---|---|---|---|---|---|---|
| Example | Yield (grams) | $M_w$ | $M_n$ | $M_w/M_n$ | Time to Clear (sec) | % o-o Bonding |
| 1 | 103.6 | 656 | 441 | 1.49 | 1 | 59 |
| 2 | 143.7 | 815 | 498 | 1.64 | 1 | 66 |
| 3 | 70.1 | 1040 | 577 | 1.80 | 110 | 74 |
| 4 | 142.0 | 748 | 467 | 1.60 | NM | NM |
| 5 | NM | 750 | 462 | 1.62 | 1 | NM |
| 6 | NM | 821 | 482 | 1.7 | NM | NM |
| 7 | 65.7 | 1061 | 569 | 1.86 | 7 | 69 |
| 8 | NM | 818 | 501 | 1.63 | 1 | NM |
| 9 | NM | 943 | 512 | 1.84 | 1 | NM |
| 10 | NM | 1025 | 533 | 1.92 | 1 | NM |
| 11 | 62.7 | 747 | 467 | 1.62 | 5 | NM |
| 12 | 61.3 | 850 | 494 | 1.72 | 29 | NM |
| C-1 | 71.1 | 587 | 414 | 1.42 | 12 | 80 |

NM = not measured

EXAMPLES 13–24 AND COMPARISONS C-2 AND C-3 NOVOLAK FORMATION

Example 13

A high ortho-ortho novolak was prepared in a 250 mL 3-necked round bottom flask by the condensation of the high ortho-ortho m-cresol oligomer (Example 1), m-cresol and p-cresol with 37% formalin using oxalic acid as catalyst. Thus, to the flask was added the oligomer (4.30 grams), m-cresol (38.90 rams; 0.36 moles), p-cresol (64.80 grams; 0.60 moles), formalin (52.7 grams; 0.65 moles), and oxalic acid (0.16 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (85.5 grams). The reaction charges are summarized in Table III. The novolak characteristics are summarized in Table IV.

Example 14

A high ortho-ortho novolak was prepared in a 250 mL 3-necked round bottom flask by the condensation of the high ortho-ortho m-cresol oligomer (Example 1), m-cresol and p-cresol with 37% formalin using oxalic acid as catalyst. Thus, to the flask was added the oligomer (21.60 grams), m-cresol (21.60 grams; 0.20 moles), p-cresol (64.80 grams; 0.60 moles), formalin (35.7 grams; 0.44 moles), and oxalic acid (0.16 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (75.9 grams). The reaction charges are summarized in Table III. The novolak characteristics are summarized in Table IV.

Example 15

A high ortho-ortho novolak was prepared in a 250 mL 3-necked round bottom flask by the condensation of the high ortho-ortho m-cresol oligomer (Example 1), m-cresol and p-cresol with 37% formalin using oxalic acid as catalyst. Thus, to the flask was added the oligomer (21.60 grams), m-cresol (21.60 grams; 0.20 moles), p-cresol (64.80 grams; 0.60 moles), formalin (33.2 grams; 0.41 moles), and oxalic acid (0.16 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (72.5 grams). The reaction charges are summarized in Table III. The novolak characteristics are summarized in Table IV.

Comparative Example 2

A conventional novolak was prepared for comparative purposes in a 250 mL 3-necked round bottom flask by the condensation of m-cresol and p-cresol with 37% formalin using oxalic acid as catalyst. This novolak was prepared without high ortho-ortho m-cresol oligomer. Thus, to the flask was added m-cresol (43.20 grams, 0.40 moles), p-cresol (64.80 grams; 0.60 moles), formalin (51.1 grams; 0.63 moles), and oxalic acid (0.16 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (82.4 grams). The reaction charges are summarized in Table III. The novolak characteristics are summarized in Table IV.

Example 16

A high ortho-ortho novolak was prepared in a 250 mL 3-necked round bottom flask by the condensation of the high ortho-ortho m-cresol oligomer (as described in Example 2) m-cresol and p-cresol with 37% formalin using oxalic acid as catalyst. Thus, to the flask was added the oligomer (35.10 grams), m-cresol (35.10 grams; 0.33 moles), p-cresol (37.8 grams; 0.35 moles), formalin 34.1 grams; 0.42 moles), and oxalic acid (0.16 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (81.1 grams). The reaction charges are summarized in Table III. The novolak characteristics are summarized in Table IV.

Example 17

A high ortho-ortho novolak was prepared in a 250 mL 3-necked round bottom flask by the condensation of the high ortho-ortho m-cresol oligomer (as described in Example 2) and p-cresol with 37% formalin using oxalic acid as catalyst. Thus, to the flask was added the oligomer (70.2 grams), p-cresol (37.8 grams; 0.35 moles), formalin (13.0 grams; 0.16 moles), and oxalic acid (0.16 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (78.9 grams). The reaction charges are summarized in Table III. The novolak characteristics are summarized in Table IV.

Example 18

A high ortho-ortho novolak was prepared in a 1,000 mL 3-necked round bottom flask by the condensation of the high ortho-ortho m-cresol oligomer (as described in Example 4) and p-cresol with 37% formalin using oxalic acid as catalyst. Thus, to the flask was added the oligomer (210.6 grams), p-cresol (113.4 grams; 1.05 moles), formalin (34.05 grams; 0.42 moles), and oxalic acid (0.48 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (230.0 grams). The reaction charges are summarized in Table III. The novolak characteristics are summarized in Table IV.

Comparative Example 3

A conventional novolak was prepared for comparative purposes in a 250 mL 3-necked round bottom flask by the condensation of m-cresol and p-cresol with 37% formalin using oxalic acid as catalyst. This novolak was prepared without high ortho-ortho m-cresol oligomer. Thus, to the flask was added m-cresol (70.20 grams, 0.65 moles), p-cresol (37.80 grams; 0.35 moles), formalin (55.1 grams; 0.68 moles), and oxalic acid (0.16 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (87.1 grams). The reaction charges are summarized in Table III. The novolak characteristics are summarized in Table IV.

Example 19

A high ortho-ortho novolak was prepared in a 250 mL 3-necked round bottom flask by the self-condensation of the high ortho-ortho m-cresol oligomer (as described in Example 4) with hexamethylenetetramine in propylene glycol methyl ether acetate. No catalyst was used. Thus, to the flask was added the oligomer (68.2 grams), propylene glycol methyl ether acetate (68.2 grams) and hexamethylenetetramine (1.46 grams; 0.01 moles). The reaction mixture was heated to a mild reflux (140°–145° C.) over a period of 45 minutes. After 18 hours at mild reflux, the reaction mixture was cooled to <100° C. Additional propylene glycol methyl ether acetate (68.2 grams) was added and the novolak was isolated as a solution. No yield was determined. The reaction charges are summarized in Table III. The novolak characteristics are summarized in Table IV.

Example 20

A high ortho-ortho novolak was prepared in a 500 mL 3-necked round bottom flask by the self-condensation of the high ortho-ortho m-cresol oligomer (as described in Example 4) and chloroacetaldehyde diethyl acetal in 1-methoxy-2-propanol and water. No catalyst was used. Thus, to the flask was added the oligomer (67.2 grams), 1-methoxy-2-propanol (107.5 grams), water (36.3 grams) and chloroacetaldehyde diethyl acetal (12.3 grams; 0.08 moles). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and catalyst. The flask was cooled yielding a light amber-colored glassy novolak (67.4 grams). The reaction charges are summarized in Table III. The novolak characteristics are summarized in Table IV.

Example 21

A high ortho-ortho novolak was prepared in a 600 mL Parr pressure reactor by the self-condensation of the high ortho-ortho m-cresol oligomer (as described in Example 4) with paraformaldehyde in propylene glycol methyl ether acetate. No catalyst was used. Thus, to the flask was added the oligomer (108.0 grams), propylene glycol methyl ether acetate (108.0 grams) and 95% paraformaldehyde (4.0 grams, 0.13 moles). The reactor was sealed and the homogeneous reaction mixture was stirred at 300 rpm. The mixture was heated to 140°–145° C. over a period of 45 minutes. After 18 hours, the reaction mixture was cooled to <100° C. Additional propylene glycol methyl ether acetate (108.0 grams) was added and the novolak was isolated as a solution. No yield was determined. The reaction charges are summarized in Table III. The novolak characteristics are summarized in Table IV.

Example 22

A high ortho-ortho novolak was prepared in 1,000 mL 3-necked round bottom flask by the condensation of the high ortho-ortho m-cresol oligomer (as described in Example 4) and p-cresol with 37% formalin using oxalic acid as catalyst. Thus, to the flask was added the oligomer (210.6 grams), p-cresol (113.4 grams; 1.05 moles), formalin (34.05 grams; 0.42 moles) and oxalic acid (0.48 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C. vacuum was applied. Vacuum was slowly increased over a period of 45 minutes and was fully applied for one additional hour. This process removed the remaining residual monomer and decomposed the catalyst. The flask was cooled yielding a light yellow glassy novolak (233.0 grams). The reaction charges are summarized in Table III. The novolak characteristics are summarized in Table IV.

Example 23

A high ortho-ortho novolak was fractionated in a 5-liter 3-necked round bottom flask fitted with a bottom outlet. To the flask was charged the novolak prepared in Example 18 (80 grams). The novolak was dissolved in acetone with agitation. To an agitated solution at room temperature was added hexane (1,920 grams) over a period of one hour. Agitation was continued for 15 additional minutes and then without agitation, the mixture was allowed to separate into two phases for 1–2 hours. The viscous bottom layer (108 grams) containing the high molecular weight portion of the fractionated novolak was taken off into a 1-liter round bottom flask. Acetone (300 mL) was added to lower the viscosity of the novolak solution. The acetone solution was vacuum stripped on a rotary evaporator with heating up to 50° C. to remove the residual acetone and hexane. The flask was cooled and a fluffy light yellow glassy novolak (67.8) grams was isolated. The reaction charges are summarized in Table III. The novolak characteristics are summarized in Table IV.

Example 24

A high ortho-ortho novolak was fractionated in a 5-liter 3-necked round bottom flask fitted with a bottom outlet. To the flask was charged the novolak prepared in Example 22 (80 grams). The novolak was dissolved in acetone with agitation. To an agitated solution at room temperature was added hexane (1,920 grams) over a period of one hour. Agitation was continued for 15 additional minutes and then without agitation, the mixture was allowed to separate into two phases for 1–2 hours. The viscous bottom layer (108 grams) containing the high molecular weight portion of the fractionated novolak was taken off into a 1-liter round bottom flask. Acetone (300 mL) was added to lower the viscosity of the novolak solution. The acetone solution was vacuum stripped on a rotary evaporator with heating up to 50° C. to remove the residual acetone and hexane. The flask was cooled and a fluffy light yellow glassy novolak (69.9) grams was isolated. The reaction charges are summarized in Table III. The novolak characteristics are summarized in Table IV.

50° C. to remove the residual acetone and hexane. The flask was cooled and a fluffy, light yellow glassy novolak (71.8 grams) was isolated. The novolak characteristics are summarized in Table IV.

TABLE III m-CRESOL/p-CRESOL/m-CRESOL OLIGOMER NOVOLAKS
REACTION CHARGES

| Example | m-Cresol (grams) | p-Cresol (grams) | Oligomer (grams) | % Olig. to total m-C | Total % m-C | Solvent Type | Solvent (grams) | Aldehyde Source | Aldehyde Source (grams) |
|---|---|---|---|---|---|---|---|---|---|
| 13 | 38.90 | 64.80 | 4.30 | 10 | 40 | None | 0.0 | 37% Formalin | 52.70 |
| 14 | 21.60 | 64.80 | 21.60 | 50 | 40 | None | 0.0 | 37% Formalin | 35.70 |
| 15 | 21.60 | 64.80 | 21.60 | 50 | 40 | None | 0.0 | 37% Formalin | 33.20 |
| C-2 | 43.20 | 64.80 | 0.00 | 0 | 40 | None | 0.0 | 37% Formalin | 51.10 |
| 16 | 35.10 | 37.80 | 35.10 | 50 | 65 | None | 0.0 | 37% Formalin | 34.10 |
| 17 | 0.00 | 37.80 | 70.20 | 100 | 65 | None | 0.0 | 37% Formalin | 13.00 |
| 18 | 0.00 | 113.40 | 210.60 | 100 | 65 | None | 0.0 | 37% Formalin | 34.05 |
| C-3 | 70.20 | 37.80 | 0.00 | 0 | 65 | None | 0.0 | 37% Formalin | 55.10 |
| 19 | 0.00 | 0.00 | 68.20 | 100 | 100 | PM-acetate | 68.2 | HMTA | 1.46 |
| 20 | 0.00 | 0.00 | 67.20 | 100 | 100 | 1-methoxy-2-propanol | 107.5 | CDA | 12.30 |
| 21 | 0.00 | 0.00 | 108.00 | 100 | 100 | PM-acetate | 108.0 | Paraformaldehyde | 4.00 |
| 22 | 0.00 | 113.40 | 210.6 | 100 | 65 | None | 0.0 | 37% Formalin | 36.50 |
| 25 | 0.00 | 113.40 | 210.6 | 100 | 65 | Mpme | 0.0 | 37% Formalin | 36.50 |

Novolaks of Examples 23, 24 amd 26 were fractionated novolaks of Examples 18, 22, and 25. Therefore no charge data is given for Examples 23, 24, and 26.

Table III. The novolak characteristics are summarized in Table IV.

Example 25

A high ortho-ortho novolak was prepared in a 1,000 mL 3-necked round bottom flask by the condensation of the high ortho-ortho m-cresol oligomer (as described in Example 8) and p-cresol with 37% formalin using oxalic acid as catalyst. Thus, to the flask was added the oligomer (210.6 grams), p-cresol (113.4 grams; 1.05 moles), formalin (36.50 grams; 0.45 moles) and oxalic acid (0.48 grams). The reaction mixture was heated to a mild reflux over a period of 45 minutes. After 18 hours at mild reflux, the reaction mixture was gradually heated to 205° C. during which time the solvent and some residual monomer was removed by atmospheric distillation. After one hour at 205° C., vacuum was applied. Vacuum was slowly increased over a period of 45 minutes and was fully applied for one additional hour. This process removed the remaining residual monomer and decomposed the catalyst. The flask was cooled yielding a light yellow glassy novolak (231.4 grams). The reaction charges are summarized in Table III. The novolak characteristics are summarized in Table IV.

Example 26

A high ortho-ortho novolak was fractionated in a 5-liter, 3-necked round bottom flask fitted with a bottom outlet. To the flask was charged the novolak prepared in Example 25 (80 grams). The novolak was dissolved in acetone (480 grams) with agitation. To an agitated solution at room temperature was added hexane (1,920 grams) over a period of one hour. Agitation was continued for 15 additional minutes and then without agitation, the mixture was allowed to separate into two phases for 1–2 hours. The viscous bottom layer containing the high molecular weight portion of the fractionated novolak was taken off into a 1-liter round bottom flask. Acetone (300 mL) was added to lower the viscosity of the novolak solution. The acetone solution was vacuum stripped on a rotary evaporator with heating up to

TABLE IV m-CRESOL/p-CRESOL/m-CRESOL
OLIGOMER NOVOLAKS
Novolak Characterization

| Example | Yield (grams) | $M_w$ | $M_n$ | $M_w/M_n$ | Time to Clear (sec) | % o-o Bonding |
|---|---|---|---|---|---|---|
| 13 | 85.5 | 40,313 | 1,165 | 34.6 | 990 | 65 |
| 14 | 75.9 | 18,675 | 1,066 | 17.5 | 422 | 59 |
| 15 | 72.5 | 10,640 | 967 | 11.0 | 139 | NM |
| C-2 | 82.4 | 6,649 | 1,029 | 6.5 | 87 | 59 |
| 16 | 81.1 | 19,650 | 1,283 | 15.3 | 77 | NM |
| 17 | 78.9 | 5,654 | 1,101 | 5.1 | 86 | 63 |
| 18 | 230 | 3,633 | 996 | 3.6 | 26 | 62 |
| C-3 | 87.1 | 6,463 | 1,326 | 4.9 | 23 | 54 |
| 19 | NM | 6,279 | 691 | 9.7 | NM | NM |
| 20 | 67.4 | 4,871 | 995 | 4.7 | 18 | NM |
| 27 | NM | 4,157 | 827 | 5.0 | NM | NM |
| 22 | 233 | 4,274 | 1,067 | 4.0 | 48 | NM |
| 23* | 67.8 | 4,325 | 1,545 | 2.8 | 36 | NM |
| 24* | 69.9 | 5,077 | 1,692 | 3.0 | 183 | NM |
| 25 | 231.4 | 4,075 | 948 | 4.3 | NM | NM |
| 26* | 179.4 | 4,762 | 1,465 | 3.3 | 108 | NM |

NM = not measured
* = Fractionated novolaks

Resist Formulations

Example 27

Resist Formulation—Novolak of Example 17 With 17% PAC and 3% Speed Enhancer

A solid novolak prepared in Example 17 (13.05 grams) was dissolved in ethyl lactate (43.8) grams). A photoactive compound (PS-9) (2.75 grams) and a speed enhancer (TRISP-PA) (0.4 grams) were then dissolved into this solution. A leveling agent (TROYKYD 366) (0.018 grams) was then added to the solution. The resultant photoresist solution was microfiltered through a 0.2 micron pore size disc filter. The solids content of this resist sample was 27% by weight. The lithographic properties of this resist is shown in Table V.

Example 28

Resist Formulation—Novolak of Example 22 With 20% PAC

A solid novolak prepared in Example 22 (12.96 grams) was dissolved in methyl-3-methoxypropionate (43.8 grams). A photoactive compound (3-TPM)(3.24 grams) was then dissolved into this solution. A leveling agent (FC-430) (0.018 grams) was then added to the solution. The resultant photoresist solution was microfiltered through a 0.2 micron pore size disc filter. The solids content of this resist sample was 27% by weight. The lithographic properties of this resist is shown in Table V.

Example 29

Resist Formulation—Novolak of Example 22 With 20% PAC

A solid novolak prepared in Example 22 (12.98 grams) was dissolved in methyl-3-methoxypropionate (43.8 grams). A photoactive compound (4-TPM)(3.24 grams) was then dissolved into this solution. A leveling agent (FC-430) (0.018 grams) was then added to the solution. The resultant photoresist solution was microfiltered through a 0.2 micron pore size disc filter. The solids content of this resist sample was 27% by weight. The lithographic properties of this resist is shown in Table V.

Example 30

Resist Formulation—Novolak of Example 23 With 20% PAC and 10% Speed Enhancer

A solid novolak prepared in Example 23 (11.66 grams) was dissolved in methyl-3-methoxypropionate (43.8 grams). A photoactive compound (4-TPM)(3.24 grams) and a speed enhancer (1,3,3,5-tetrakis(4-hydroxyphenol)pentane) (1.296 grams) were then dissolved into this solution. A leveling agent (FC-430) (0.018 grams) was then added to the solution. The resultant photoresist solution was microfiltered through a 0.2 micron pore size disc filter. The solids content of this resist sample was 27% by weight. The lithographic properties of this resist is shown in Table V.

Example 31

Resist Formulation—Novolak of Example 23 With 20% PAC and 10% Speed Enhancer

A solid novolak prepared in Example 23 (11.66 grams) was dissolved in methyl-3-methoxypropionate (43.8 grams). A photoactive compound (3-TPM)(3.24 grams) and a speed enhancer (1,3,3,4-tetrakis(4-hydroxyphenol)pentane) (1.296 grams) were then dissolved into this solution. A leveling agent (FC-430) (0.018 grams) was then added to the solution. The resultant photoresist solution was microfiltered through a 0.2 micron pore size disc filter. The solids content of this resist sample was 27% by weight. The lithographic properties of this resist is shown in Table V.

Example 32

Resist Formulation—Novolak of Example 24 With 20% PAC and 15% Speed Enhancer

A solid novolak prepared in Example 24 (11.02 grams) was dissolved in methyl-3-methoxypropionate (43.8 grams). A photoactive compound (4-TPM)(3.24 grams) and a speed enhancer (1,3,3,5-tetrakis(4-hydroxyphenol)pentane) (1.94 grams) were then dissolved into this solution. A leveling agent (FC-430) (0.018 grams) was then added to the solution. The resultant photoresist solution was microfiltered through a 0.2 micron pore size disc filter. The solids content of this resist sample was 27% by weight. The lithographic properties of this resist is shown in Table V.

Example 33

Resist Formulation—Novolak of Example 24 With 20% PAC and 12% Speed Enhancer

A solid novolak prepared in Example 24 (11.40 grams) was dissolved in methyl-3-methoxypropionate (43.8 grams). A photoactive compound (3-TPM)(3.24 grams) and a speed enhancer (1,3,3,5-tetrakis(4-hydroxyphenol)pentane) (1.55 grams) were then dissolved into this solution. A leveling agent (FC-430) (0.018 grams) was then added to the solution. The resultant photoresist solution was microfiltered through a 0.2 micron pore size disc filter. The solids content of this resist sample was 27% by weight. The lithographic properties of this resist is shown in Table V.

Example 34

Resist Formulation based on Novolak of Example 26 with 21% PAC and 8.5% Speed Enhancer

A solid novolak prepared in Example 26 (12.0 grams) was dissolved in methyl-3-methoxypropionate (44.87 grams). A photoactive compound (3-TPM) (3.485 grams) and a speed enhancer (1,3,3,5-tetrakis(4-hydroxyphenyl)-pentane) (1.11 grams) were then dissolved into this solution. A leveling agent (FC-430) (0.018 grams) was then added to the solution. The resultant photoresist solution was microfiltered through 0.2 micron pore size disc filter. The solids concent of this resist sample was 27% by weight. The lithographic properties of this resist is shown in Table V.

3-TPM and 4-TPM PAC's:

The 3-TPM pAC is the product of esterifying one mole of bis-([3,5-dimethyl-4-hydroxyphenyl]-3-methoxy-4-hydroxyphenyl)-methane with 2.6 moles of 2,1-diazonaphthoquinone, 5-sulfonylchloride (DNQ). The 4-TPM PAC is the product of esterifying one mole of bis-[3,5-dimethyl-4-hydroxyphenyl]-3,4-dihydroxyphenylmethane with 2.24 moles of 2,1-diazonaphthoquinone, 5-sulfonylchloride (DNQ).

TRISP-PA Speed Enhancer:
  1-[1'-methyl-1'1(4'-hydroxyphenyl)-ethyl]1-[1',1-bis-(bis-(4-hydroxyphenyl)ethyl]benzene PS-PAC
  The PS-9 is the product of esterifying about 5.4 moles of 2,1-diazonaphthoquinone-5-sulfonyl chloride (DNQ) with one mole of 2,6-bis [(2,3,4-trihydroxy phenyl)methyl]-4-methyl phenol.

TROYKYD 366 Leveling Agent
  nonionic silicon-modified polymer

FC-430 FLUORAD Leveling Agent
  fluoro-aliphatic polymeric ester surfactant

Photoresist Processing

A. Photoresist Coatings

Photoresist solutions so prepared as above was be spin-coated onto four-inch silicon wafers, which were primed with hexamethyldisilazane (HMDS). The coated wafers were softbaked on a hot plate for 60 seconds at 90° C. Uniform coatings, of about 0.99 microns (except Example 25 which was 1.18 microns) in thickness were obtained by spinning at velocities ranging from 4,000 to 6,000 RPM for 30 seconds, depending upon the solution viscosity. If necessary, the solids content were adjusted to fit this spin speed range.

B. Exposure of Photoresist Coatings

Photoresist coatings were exposed on a Canon I-line step and repeat exposure tool equipped with a 0.52 numerical aperture lens. This exposure tool provides a narrow spectral output at 365 nm.

C. Post-Exposure Bake

A post-exposure bake was carried out for each photoresist coating at 120° C. for 60 seconds on a hot plate.

D. Development of Exposed Photoresist Coatings

The exposed photoresist coatings were puddle developed using a 2.38% weight percent tetramethyl ammonium hydroxide aqueous developer solution in a two second spray and 58 second dwell cycle followed by ten second rinse and 70 second spin-drying step.

E. Photoresist Performance Evaluations

The photoresist formulations were evaluated for photospeed ($E_{opt}$ and $E_0$); line and space resolution; depth of focus (DOF) at 0.5 micron line/space features, and Gamma. The results are shown in Table V.

The photoresists made from the novolaks of the present invention exhibited good profiles; useful photospeeds; sub-halfmicron line and space resolution with no scum; as well as very good depth of focus with high imaging integrity.

TABLE V

RESIST FORMULATION AND FUNCTIONAL RESULTS

| Example No. | Novolak Example | % SE | PAC | % PAC | Eopt (mJ/cm$^2$) | Resolution (um) | DOF @ 0.5 um (um) | Gamma | E$_0$ |
|---|---|---|---|---|---|---|---|---|---|
| 27 | 17 | 3 | PS-9 | 17 | 105 | 0.4 | 1.4 | NM | NM |
| 28 | 22 | 0 | 4-TPM | 20 | <100 | NM | NM | 2.35 | 48 |
| 29 | 22 | 0 | 3-TPM | 20 | 240 | 0.40 | 1.5 | 5.00 | 130 |
| 30 | 23 | 10 | 4-TPM | 20 | 70 | 0.43 | 2.1 | 3.28 | 45 |
| 31 | 23 | 10 | 3-TPM | 20 | 240 | 0.37 | 1.7 | 3.80 | 130 |
| 32 | 24 | 15 | 4-TPM | 20 | NM | NM | NM | 3.98 | 35 |
| 33 | 24 | 12 | 3-TPM | 20 | 260 | 0.35 | 1.4* | 3.70 | 130 |
| 34 | 26 | 8.5 | 3-TPM | 21 | 300 | 0.32 | 1.5 | 4.95 | 120 |

*Depth of focus was 0.9 microns at 0.4 micron line/space features.
NM = not measured While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. The process for forming positive resist patterns on a substrate comprising:

A. coating said substrate with a radiation composition useful as a positive-working photoresist, said composition comprising an admixture of at least one o-quinonediazide compound and a novolak resin composition having a weight average molecular weight from 3,000 to 40,000, having ortho-ortho bonding of between 55% and 70% of the methylene bonds between the phenolic moieties in the novolak, a time to clear of at least 20 seconds per micron and prepared by a process comprising the steps of:

(1) reacting a first phenolic monomer comprising a major portion of at least one trifunctional phenolic monomer with a first aldehyde source in the absence of a catalyst at a reaction temperature from about 100° C. to about 200° C. and at a reaction pressure of about 2 atmospheres to about 15 atmospheres to form a phenolic oligomer having a weight average molecular weight from about 500 to about 2,000, having ortho-ortho bonding of about 55% to about 75% of the methylene bonds between the phenolic moieties, and having a time to clear of less than 15 seconds per micron; wherein the mole ratio of said first aldehyde source to said first phenolic monomer is from about 0.3:1.0 to about 0.55:1.0;

(2) then reacting said phenolic oligomer with a second aldehyde source and an optional second phenolic source at a temperature from about 80° C. to about 150° C. to form a phenolic novolak having a weight average molecular weight of 3,000 to 40,000, having ortho-ortho bonding of between 55% and 70% of the methylene bonds between the phenolic moieties, and having a time to clear of at least 20 seconds per micron; wherein the mole ratio of said second aldehyde source to said total phenolic moieties is less than about 0.8:1.0; and wherein the amount of said o-quinonediazide compound being about 5% to about 40% by weight and the amount of said binder resin being about 60% to 95% by weight, based on the total solid content of said radiation-sensitive composition;

B. subjecting said coating on said substrate to an image-wise exposure of radiant energy; and C. subjecting said image-wise exposed coated substrate to a developing solution wherein the exposed areas of said exposed coating are dissolved and removed from the substrate, thereby resulting in a positive image-wise pattern in the coating.

2. The process of claim 1 wherein said first phenolic monomer comprises at least 100% by moles of a trifunctional phenolic monomer.

3. The process of claim 1 wherein said first phenolic monomer comprises at least 100% by moles of a trifunctional phenolic monomer.

4. The process of claim 1 wherein said first phenolic monomer is meta-cresol.

5. The process of claim 1 wherein said first aldehyde source is paraformaldehyde.

6. The process of claim 1 wherein said second aldehyde source is paraformaldehyde.

7. The process of claim 1 wherein said second phenolic source is added and is selected from the group consisting of para-cresol and a mixture of para-cresol and meta-cresol having a mole ratio from 10:90 to 90:10.

8. The process of claim 1 wherein said phenolic oligomer is isolated after step (1) and before its reaction in Step (2).

9. The process of claim 1 wherein said mole ratio of said second aldehyde source to said first phenolic source is from 0.4:1 to about 0.47:1.

10. The process of claim 1 wherein said mole ratio of said second aldehyde source to said total phenolic moieties is from about 0.1:1 to about 0.7:1.

11. The process of claim 1 wherein said novolak resin is fractionated to remove low molecular weight fractions.

12. The process of claim 11 wherein the fractionation method is liquid phase separation followed by distillation.

* * * * *